United States Patent
Shih

(10) Patent No.: US 10,910,357 B2
(45) Date of Patent: Feb. 2, 2021

(54) SEMICONDUCTOR PACKAGE INCLUDING HYBRID BONDING STRUCTURE AND METHOD FOR PREPARING THE SAME

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/360,619

(22) Filed: Mar. 21, 2019

(65) Prior Publication Data

US 2020/0303361 A1  Sep. 24, 2020

(51) Int. Cl.
| | |
|---|---|
| H01L 25/18 | (2006.01) |
| H01L 21/822 | (2006.01) |
| H01L 21/768 | (2006.01) |
| H01L 23/528 | (2006.01) |
| H01L 23/522 | (2006.01) |
| H01L 23/48 | (2006.01) |
| H01L 23/00 | (2006.01) |
| H01L 25/00 | (2006.01) |

(52) U.S. Cl.
CPC ........ H01L 25/18 (2013.01); H01L 21/76898 (2013.01); H01L 21/8221 (2013.01); H01L 23/481 (2013.01); H01L 23/5226 (2013.01); H01L 23/5283 (2013.01); H01L 24/09 (2013.01); H01L 24/17 (2013.01); H01L 24/33 (2013.01); H01L 24/73 (2013.01); H01L 25/50 (2013.01); *H01L 2224/73253* (2013.01)

(58) Field of Classification Search
CPC ............... H01L 25/0657; H01L 25/074; H01L 2225/06541; H01L 2225/06565
See application file for complete search history.

(56) References Cited

U.S. PATENT DOCUMENTS

| | | | |
|---|---|---|---|
| 2011/0026232 A1* | 2/2011 | Lin | H01L 24/16 |
| | | | 361/760 |
| 2013/0154112 A1* | 6/2013 | Zhang | H01L 23/49827 |
| | | | 257/774 |
| 2020/0111763 A1* | 4/2020 | Hong | H01L 24/80 |

FOREIGN PATENT DOCUMENTS

| | | |
|---|---|---|
| TW | 201320298 A1 | 5/2013 |
| TW | 201413913 A | 4/2014 |
| TW | 201519383 A | 5/2015 |

OTHER PUBLICATIONS

An Office Action from the corresponding Taiwanese application, dated Nov. 18, 2019.

* cited by examiner

*Primary Examiner* — Robert G Bachner
*Assistant Examiner* — Molly K Reida
(74) *Attorney, Agent, or Firm* — Muncy, Geissler, Olds & Lowe, P.C.

(57) ABSTRACT

The present disclosure provides a semiconductor package structure. The semiconductor package structure includes a first die, a second die and a hybrid bonding structure disposed between the first die and the second die. The first die includes a first front side and a first back side opposite to the first front side. The second die includes a second front side and a second back side opposite to the second front side. The hybrid bonding structure is disposed between the first back side of the first die and the second front side of the second die. The first die and the second die are bonded to each other by the hybrid bonding structure. The hybrid bonding structure includes an organic barrier layer and an inorganic barrier layer bonded to each other.

17 Claims, 11 Drawing Sheets

SEMICONDUCTOR PACKAGE INCLUDING HYBRID BONDING STRUCTURE AND METHOD FOR PREPARING THE SAME

TECHNICAL FIELD

The present disclosure relates to a semiconductor package structure and a method for preparing the same, and more particularly, to a three-dimensional integrated circuit (3DIC) semiconductor package structure and a method for preparing the same.

DISCUSSION OF THE BACKGROUND

Semiconductor devices are essential for many modern applications. With the advancement of electronic technology, semiconductor devices are becoming smaller in size while having greater functionality and greater amounts of integrated circuitry. Due to the miniaturized scale of semiconductor devices, chip-on-chip technique is now widely used for manufacturing semiconductor packages.

In one approach, using a stack of at least two chips (or dies) in a 3D package to form, for example, a memory device, it is possible to produce a product having a memory capacity which is twice as large as that obtainable through other semiconductor integration processes. In addition to the increase in memory capacity, a stacked package also provides improved mounting density and mounting area utilization efficiency. Due to such advantages, research and development of stacked package technology has accelerated.

The manufacturing of semiconductor devices is becoming more complex. The semiconductor device is assembled with a number of integrated components including various materials having different thermal properties. Because many components with different materials are combined, the complexity of the manufacturing operations of the semiconductor device is increased. Accordingly, there is a continuous need to improve the manufacturing process of semiconductor devices and address the above complexities.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a semiconductor package structure. The semiconductor package structure includes a first die, a second die and a hybrid bonding structure disposed between the first die and the second die. The first die includes a first front side and a first back side opposite to the first front side. The second die includes a second front side and a second back side opposite to the second front side. The hybrid bonding structure is disposed between the first back side of the first die and the second front side of the second die. The first die and the second die are bonded to each other by the hybrid bonding structure. The hybrid bonding structure includes an organic barrier layer and an inorganic barrier layer bonded to each other.

In some embodiments, the first die further includes a first through-silicon via (TSV) structure exposed through the first back side and a first interconnect structure disposed over the first front side. In some embodiments, the first TSV structure is electrically connected to the first interconnect structure.

In some embodiments, the first TSV structure includes a protrusion extending into the hybrid bonding structure.

In some embodiments, a height of the protrusion of the first TSV structure is between approximately 1 μm and approximately 5 μm.

In some embodiments, the second die further includes a second TSV structure exposed through the second back side, a second interconnect structure disposed over the second front side, and a bonding pad exposed through the second front side. In some embodiments, the second interconnect structure is electrically connected to the second TSV structure and the bonding pad.

In some embodiments, the first TSV structure of the first die is bonded to the bonding pad of the second die.

In some embodiments, the semiconductor package structure further includes a conductive member disposed over the second back side of the second die. In some embodiments, the conductive member is electrically connected to the second TSV structure.

In some embodiments, the organic layer of the hybrid bonding structure includes benzocyclobutene (BCB), polybenzoxazoles (PBO), or polyimide (PI).

In some embodiments, a thickness of the organic barrier layer is between approximately 1 μm and approximately 5 μm.

In some embodiments, the inorganic barrier layer of the hybrid bonding structure includes silicon nitride (SiN), silicon oxynitride (SiON), or silicon carbon nitride (SiCN).

In some embodiments, a thickness of the inorganic barrier layer is between approximately 0.1 μm and approximately 2 μm.

One aspect of the present disclosure provides a method for preparing a semiconductor package structure. The method includes the following steps. A first die having a first front side, a first back side opposite to the first front side, and a first TSV structure disposed in the first die is provided. A portion of the first die at the first back side is removed to expose the first TSV structure. An organic barrier layer is disposed over the first back side of the first die. A second die having a second front side, a second back side opposite to the second front side, a bonding pad exposed through the second front side, and an inorganic barrier layer disposed over the second front side is provided. The organic barrier layer of the first die and the inorganic barrier layer of the second die are bonded, and the first TSV structure of the first die and the bonding pad of the second die are bonded.

In some embodiments, a protrusion of the first TSV structure protrudes from the first back side of the first die after the removal of the portion of the first die.

In some embodiments, a height of the protrusion of the first TSV structure is between approximately 1 μm and approximately 5 μm.

In some embodiments, the disposing of the organic layer further includes the following steps. The organic barrier layer is disposed to envelop the protrusion of the first TSV structure. A planarization is performed to expose an end surface of the protrusion.

In some embodiments, the end surface of the protrusion and a top surface of the organic barrier layer are coplanar after the planarization.

In some embodiments, the organic barrier layer includes BCB, POB or PI.

In some embodiments, the inorganic barrier layer includes SiN, SiON or SiCN.

In some embodiments, the second die includes a second TSV structure disposed therein.

In some embodiments, the method further includes the following steps. A portion of the second die at the second back side is removed to expose the second TSV structure. A conductive member is disposed over the second back side of the second die. In some embodiments, the conductive member is electrically connected to the second TSV structure.

In the present disclosure, a method for preparing a semiconductor package structure is provided. According to the method, a first die and a second die are bonded to each other by a hybrid bonding structure. The hybrid bonding structure includes an organic layer and an inorganic layer. Significantly, both of the organic and inorganic layers perform a metal diffusion prevention function. Therefore, even if a misalignment issue arises between the first TSV structure of the first die and the bonding pad of the second die, metal diffusion can be prevented by the hybrid bonding structure. Alternatively, in some embodiments, when there is a size difference between the first TSV structure and the bonding pad, metal diffusion can be prevented by the hybrid bonding structure.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1:
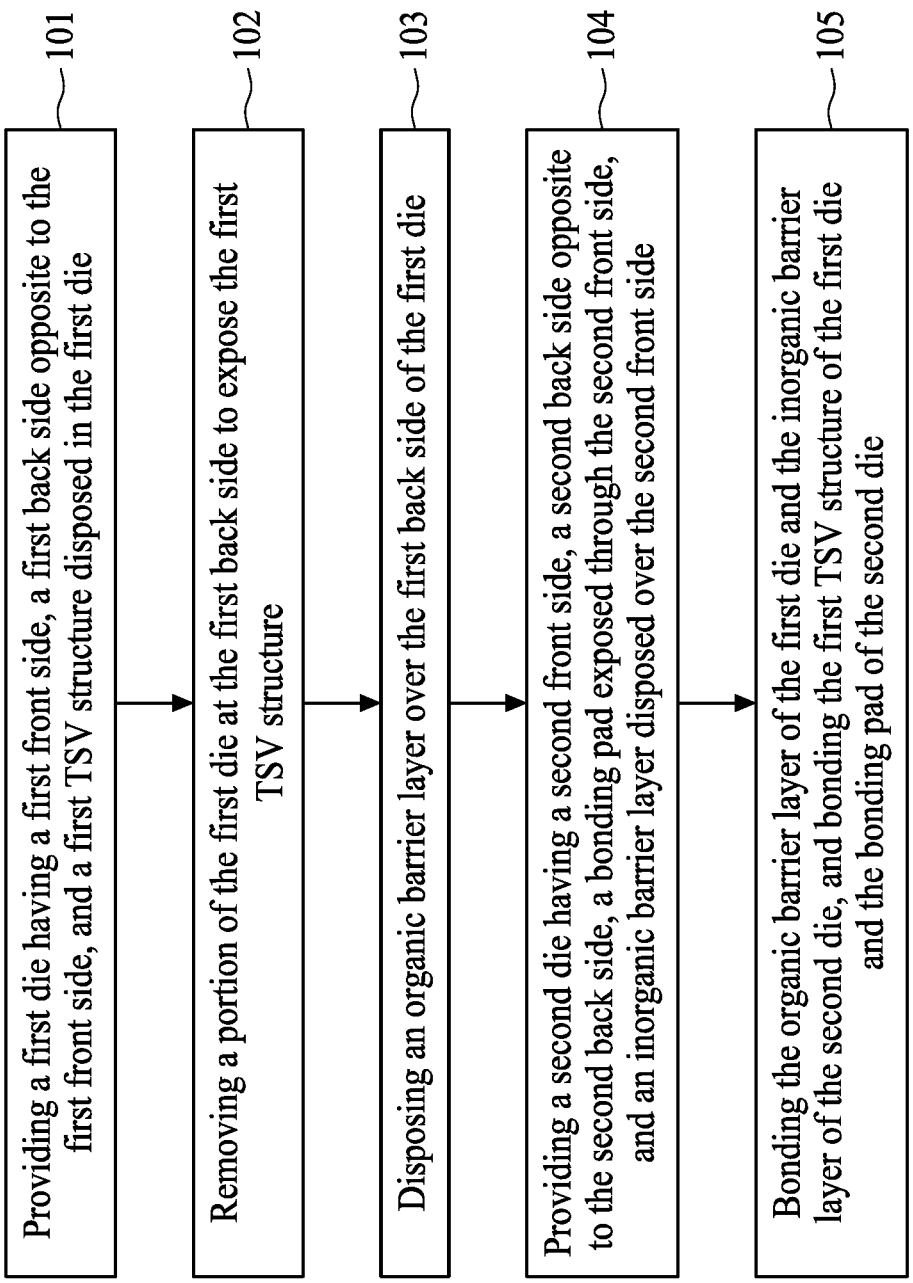
FIG. 1 is a flow diagram illustrating a method for preparing a semiconductor package structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a flow diagram illustrating a method for preparing a semiconductor package structure 10 in accordance with a first embodiment of the present disclosure. The method for preparing a semiconductor structure 10 includes a step 101, providing a first die having a first front side, a first back side opposite to the first front side, and a first TSV structure disposed in the first die. The method for preparing a semiconductor structure 10 includes a step 102, removing a portion of the first die at the first back side to expose the first TSV structure. The method 10 further includes a step 103, disposing an organic barrier layer over the first back side of the first die. The method 10 further includes a step 104, providing a second die having second front side, a second back side opposite to the second front side, a bonding pad exposed through the second front side, and an inorganic barrier layer disposed over the second front side. The method 10 further includes a step 105, bonding the organic barrier layer of the first die and the inorganic barrier layer of the second die, and bonding the first TSV structure of the first die and the bonding pad of the second die. The method for preparing the semiconductor package structure 10 will be further described according to one or more embodiments below.

Figure 2A:
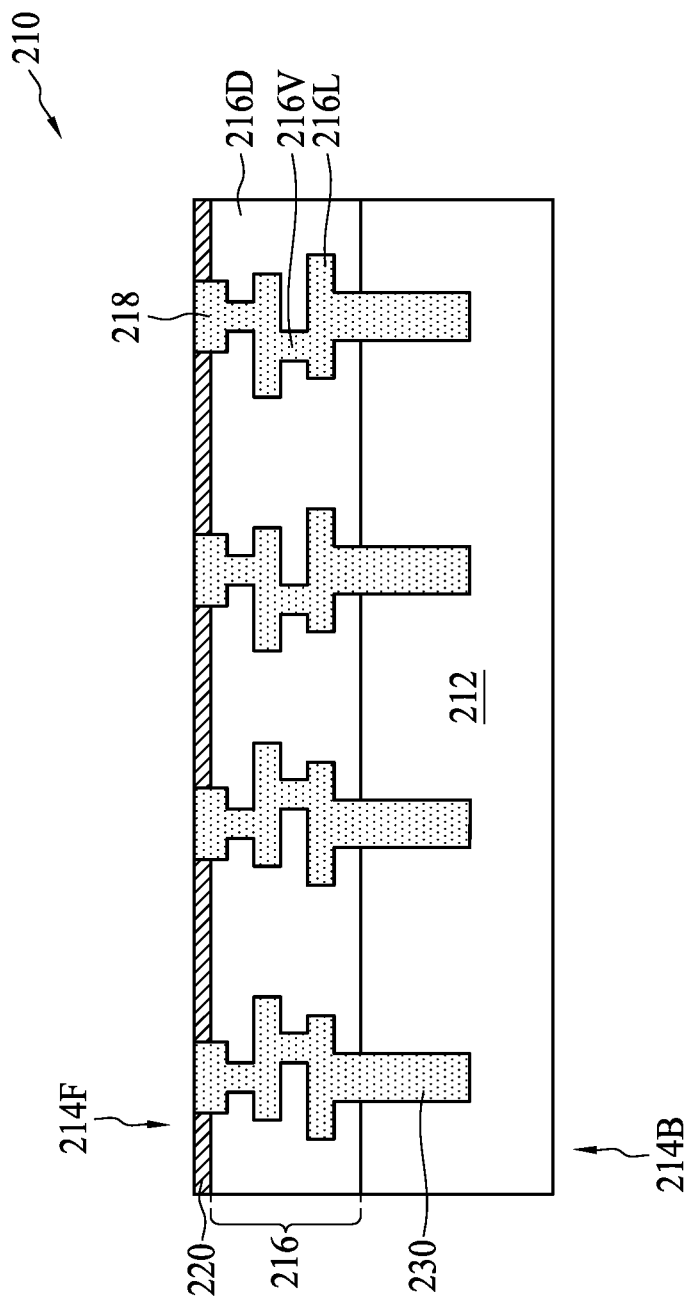
FIGS. 2A, 2B, 2C, 2D, 2E, 2F, 2G and 2H are schematic diagrams illustrating various fabrication stages of the method for preparing the semiconductor package structure in accordance with some embodiments of the present disclosure.

FIGS. 2A, 2B, 2C, 2D, 2E, 2F, 2G and 2H are schematic diagrams illustrating various fabrication stages of the method for preparing the semiconductor package structure in accordance with some embodiments of the present disclosure. Referring to FIG. 2A, a first die 210 is provided according to step 101. In some embodiments, the first die 210 includes a substrate 212, wherein the substrate 212 is fabricated with a predetermined functional circuit produced by photolithography processes. In some embodiments, the first die 210 includes a variety of electrical circuits suitable for a particular application. In some embodiments, the electrical circuits include various devices such as transistors, capacitors, resistors, diodes or the like. In some embodiments, the first die 210 includes any one of various known types of semiconductor devices to form an accelerated processing unit (APU), a central processing unit (CPU), a graphic processing unit (GPU), microprocessors, application-specific integrated circuits (ASICs), digital signal processors (DSPs), memories, dynamic random access memories (DRAMs), NAND flash memory, or the like. In some embodiments, the first die 210 includes a first front side 214F and a first back side 214B opposite to the first front side 214F. In some embodiments, the abovementioned circuits or electrical components are disposed over the first front side 214F of the first die 210, and thus the first front side 214F is referred to as an active side while the first back side 214B is referred to as an inactive side where the circuits or electrical components are absent.

In some embodiments, the first die includes a first interconnect structure 216 disposed over the first front side 214F. The first interconnect structure 216 can include a plurality of connecting lines 216L and a plurality of connecting vias 216V disposed in a plurality of dielectric layers 216D, wherein the plurality of connecting lines 216L are electrically connected by the plurality of connecting vias 216V. Further, the abovementioned circuits or electrical components are electrically connected to the first interconnect structure 216. The plurality of connecting lines 216L and the plurality of connecting vias 216V can include aluminum (Al), copper (Cu), or tungsten (W), but the disclosure is not limited thereto. In some embodiments, a diffusion barrier layer (not shown) such as, for example but not limited thereto, titanium nitride (TiN) or tantalum nitride (TaN) can be disposed between the plurality of connecting lines/connecting vias 216L/216V and the plurality of dielectric layers 216D. The plurality of dielectric layers 216D can be, for example but not limited thereto, silicon oxide (SiO), phosphosilicate glass (PSG), borophosphosilicate glass (BPSG) or low dielectric constant (k) material, such as fluorosilicate glass (FSG), organosilicate glass (OSG), or a combination thereof.

In some embodiments, the first die 210 includes a bonding pad 218 disposed over the first front side 214F and electrically connected to the connecting line 216L. The bonding pad 218 provides a larger surface for electrical connection to other elements. In some embodiments, the first die 210 may include an inorganic barrier layer 220 disposed over the first front side 214F. Significantly, the bonding pad 218 is exposed through the inorganic barrier layer 220. In some embodiments, the inorganic barrier layer 220 includes silicon nitride (SiN), silicon oxynitride (SiON), or silicon carbon nitride (SiCN), but the disclosure is not limited thereto. In some embodiments, a thickness of the inorganic barrier layer 220 is between approximately 0.1 μm and approximately 2 μm, but the disclosure is not limited thereto. The first die 210 further includes a first TSV structure 230 disposed therein. As shown in FIG. 2A, the first TSV structure 230 is disposed in the substrate 212 and is electrically connected to the first interconnect structure 216.

Figure 2B:
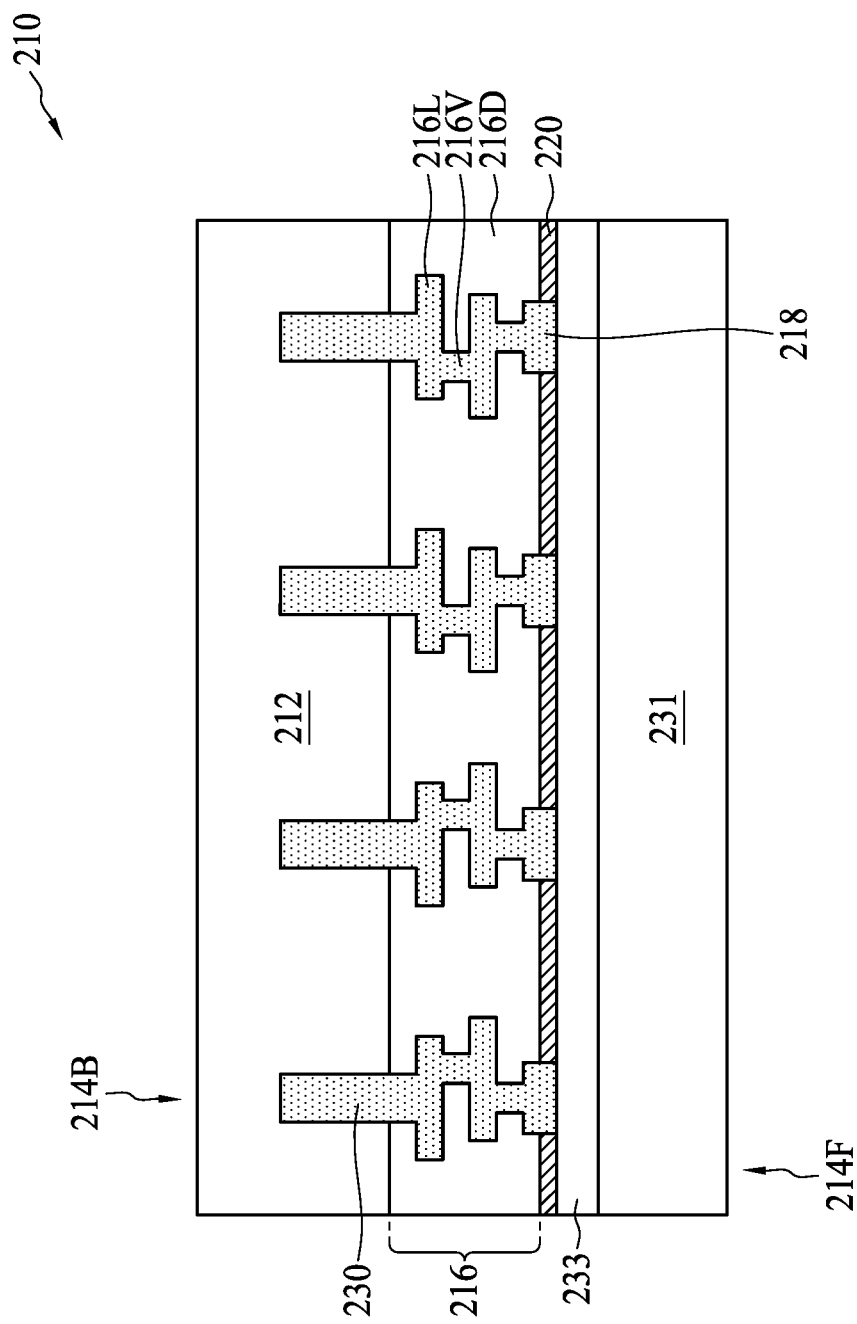

Referring to FIG. 2B, the first die 210 can be flipped and attached to a carrier substrate 231 by the first front side 214F. In some embodiments, the first die 210 is temporarily attached to the carrier substrate 231 by a release film 233. In some embodiments, the release film 233 may be a fluorine-base film, a silicon-coated polyethylene terephthalate film, a polymethylpentene film, a polypropylene film, or another suitable material, but the disclosure is not limited thereto. In some embodiments, the carrier substrate 231 is configured to support a die, a chip or a package. In some embodiments, the carrier substrate 231 is a semiconductive substrate or a wafer. In some embodiments, the carrier substrate 231 is a silicon wafer, a glass wafer or the like.

Figure 2C:
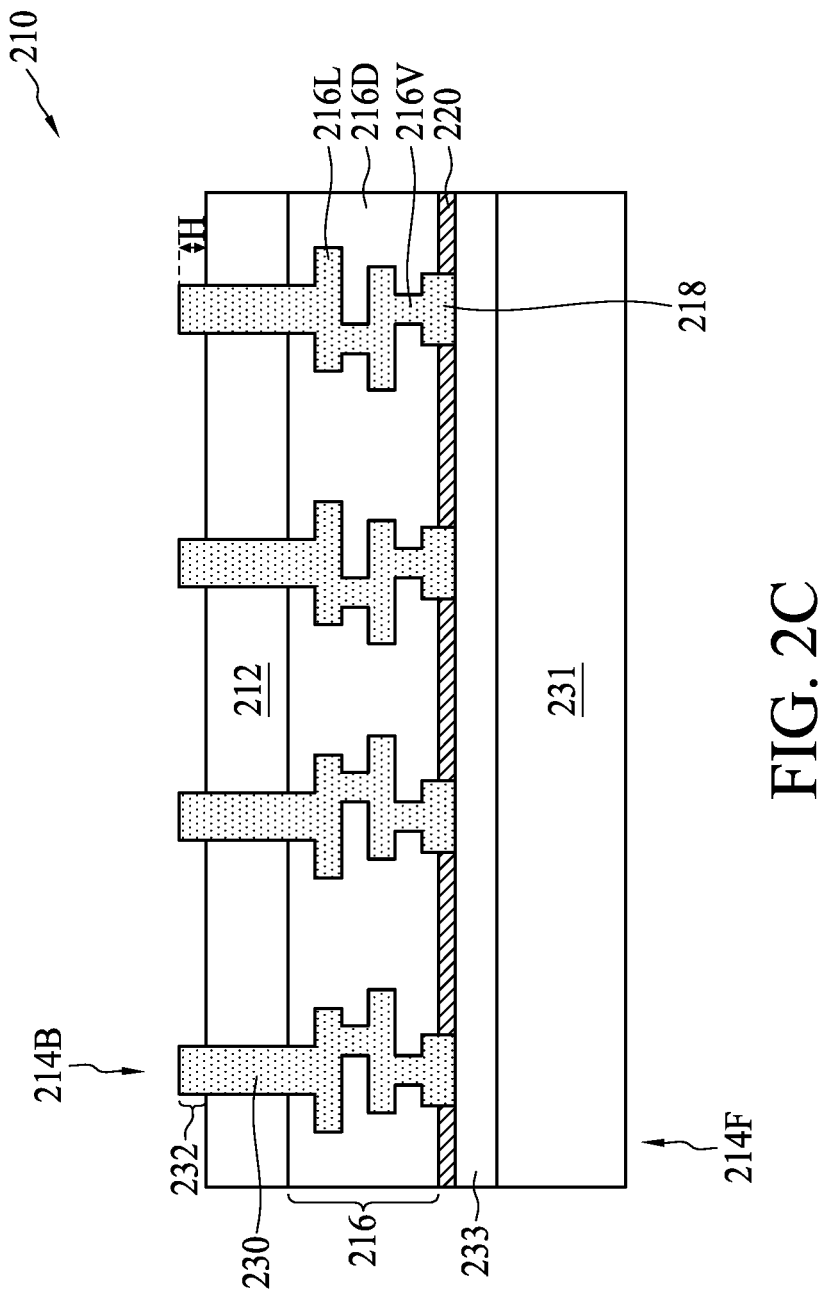

Referring to FIG. 2C, a portion of the first die 210 is removed at the first back side 214B according to step 102. Significantly, a portion of the substrate 212 is removed such that a portion of the first TSV structure 230 is exposed. In some embodiments, a planarization such as chemical mechanical polishing (CMP) can be performed, and an etching process is subsequently performed to remove the portion of the substrate 212. Consequently, the portion of the first TSV structure 230 is exposed as shown in FIG. 2C. In some embodiments, the portion of the first TSV structure 230 protrudes from the first back side 214B of the first die 210, and such portion is referred to as a protrusion 232. In other words, a protrusion 232 of the first TSV structure 230 protrudes from the first back side 214B of the first die 210 after the removal of the portion of the first die 210. Further, a height H of the protrusion 232 of the first TSV structure 230 is between approximately 1 μm and approximately 5 μm, but the disclosure is not limited thereto. In some embodiments, the height H of the protrusion 232 of the first TSV structure 230 is approximately 3 μm, but the disclosure is not limited thereto.

Figure 2D:
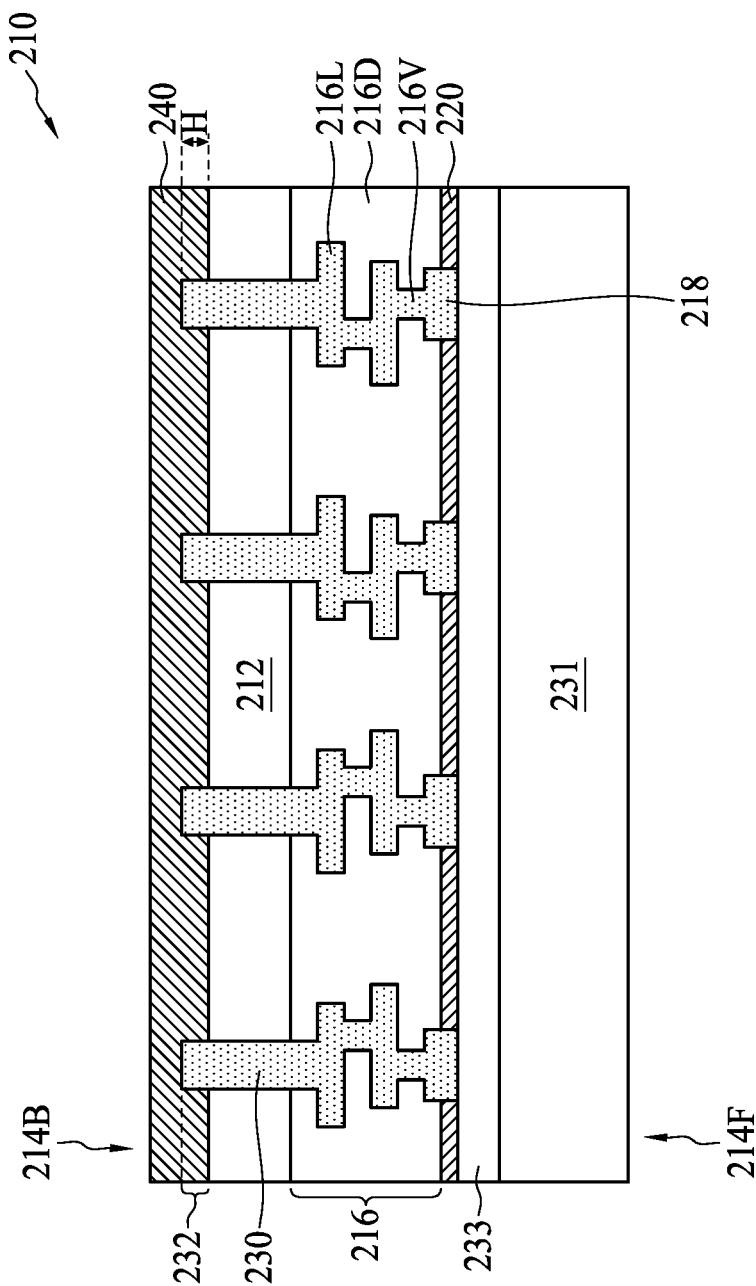
Figure 2E:
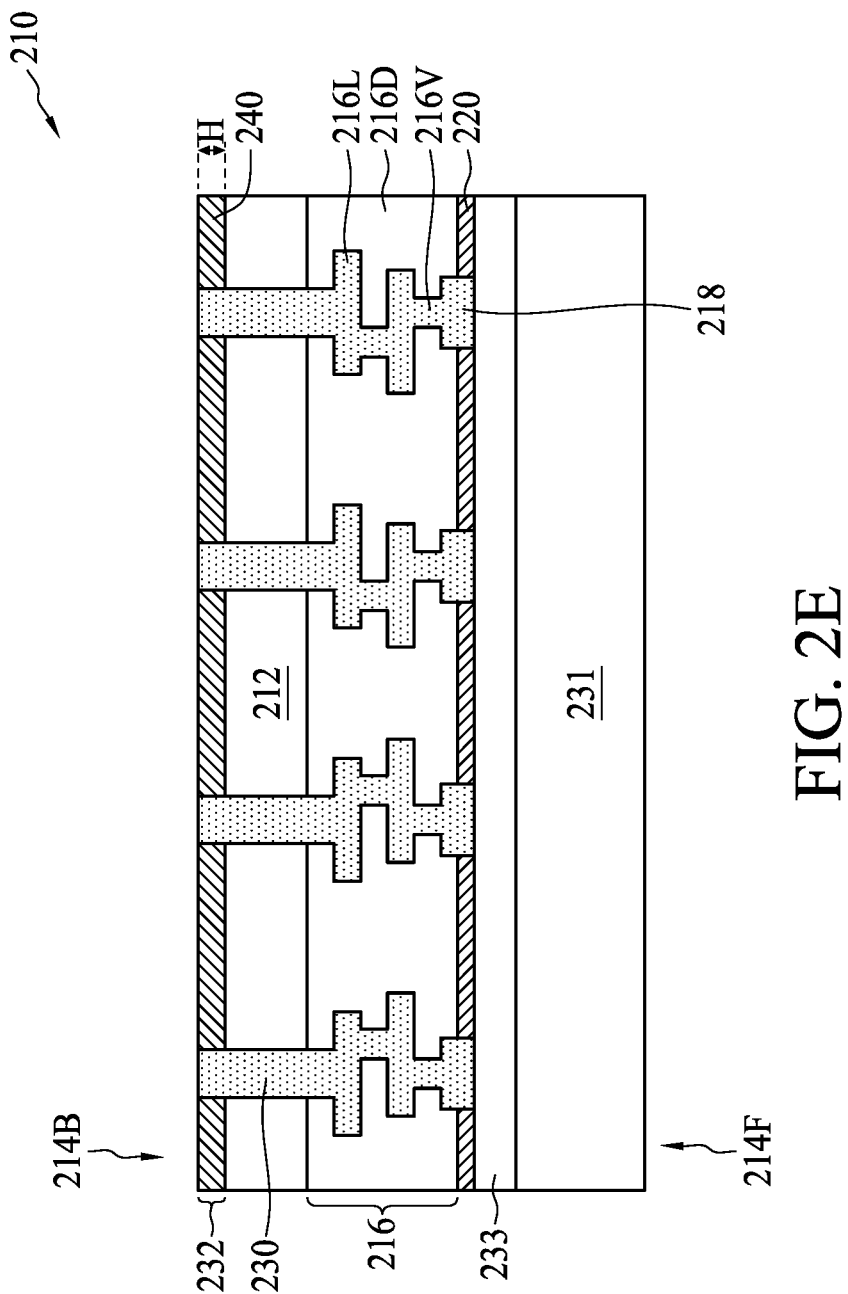

Referring to FIGS. 2D and 2E, an organic barrier layer 240 is disposed over the first back side 214B of the first die 210, according to step 103. In some embodiments, the organic barrier layer 240 is disposed to envelop the protrusion 232 of the first TSV structure 230, as shown in FIG. 2D. A thickness of the organic barrier layer 240 is greater than the height H of the protrusion 232 of the first TSV structure 230. It should be noted that in such embodiments, the organic barrier layer 240 is thick enough to envelop the protrusion 232 entirely. In some embodiments, the organic barrier layer 240 includes benzocyclobutene (BCB), polybenzoxazoles (PBO), or polyimide (PI), but the disclosure is not limited thereto. Referring to FIG. 2E, a planarization is performed on the organic barrier layer 240 to expose an end surface of the protrusion 232. Significantly, the end surface of the protrusion 232 and a top surface of the organic barrier layer 240 are coplanar after the planarization, as shown in FIG. 2E.

Figure 2F:
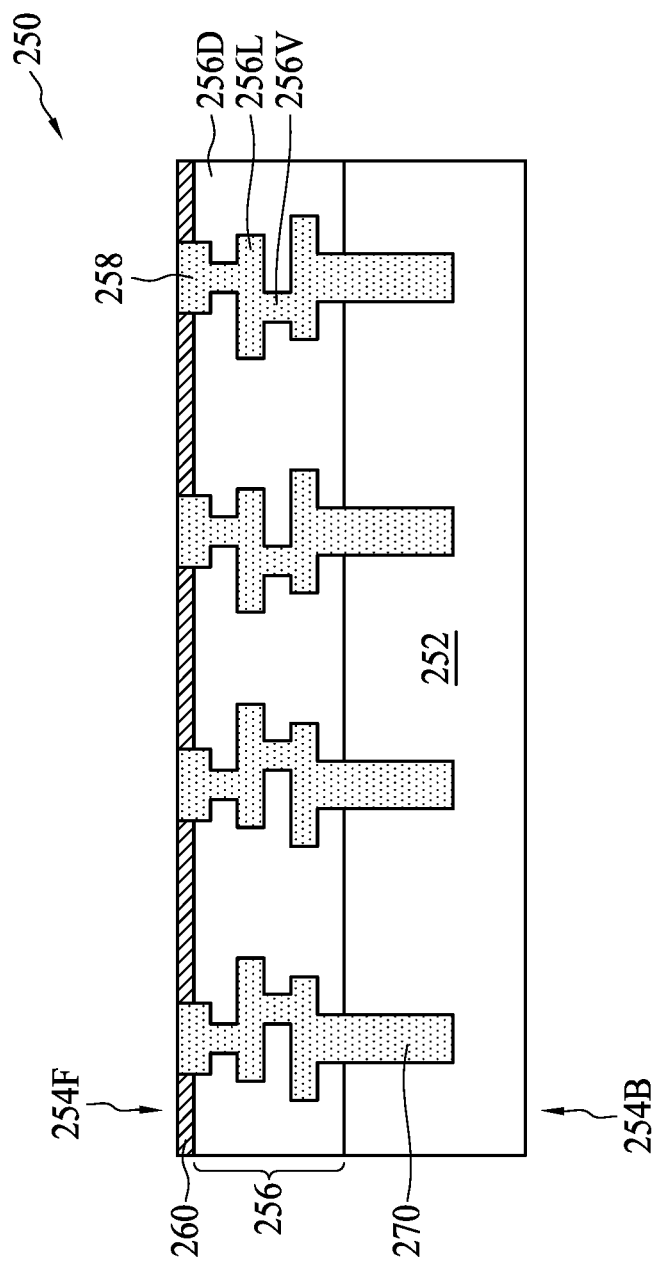

Referring to FIG. 2F, a second die 250 can be provided according step 104. In some embodiments, the second die 250 includes a substrate 252, wherein the substrate 252 is fabricated with a predetermined functional circuit produced by photolithography processes. In some embodiments, the second die 250 includes a variety of electrical circuits suitable for a particular application. In some embodiments, the electrical circuits include various devices such as transistors, capacitors, resistors, diodes or the like. In some embodiments, the second die 250 includes any one of various known types of semiconductor devices to form an APU, a CPU, a GPU, microprocessors, ASICs, DSPs, memories, DRAMs, NAND flash memory, or the like. In some embodiments, the second die 250 includes a second front side 254F and a second back side 254B opposite to the second front side 254F. In some embodiments, the abovementioned circuits or electrical components are disposed over the second front side 254F of the second die 250, and thus the second front side 254F is referred to as an active side while the second back side 254B is referred to as an inactive side where the circuits or electrical components are absent.

In some embodiments, the second die 250 includes a second interconnect structure 256 disposed over the second front side 254F. The second interconnect structure 256 can include a plurality of second connecting lines 256L and a plurality of connecting vias 256V disposed in a plurality of dielectric layers 256D, wherein the plurality of connecting lines 256L are electrically connected by the plurality of connecting vias 256V. Further, the abovementioned circuits or electrical components are electrically connected to the second interconnect structure 256. Materials used to form the plurality of connecting lines/connecting vias 256L/256V and the plurality of dielectric layers 256D of the second interconnect structure 250 can be similar to those used to form the plurality of connecting lines/vias 216L/216V and the plurality of dielectric layers 216D of the first interconnect structure 216, and therefore such details are omitted in the interest of brevity.

In some embodiments, the second die 250 includes a bonding pad 258 disposed over the second front side 254F and electrically connected to the connecting line 256L. The bonding pad 258 provides a larger surface for electrical connection to other elements. In some embodiments, the second die 250 includes an inorganic barrier layer 260 disposed over the second front side 254F. Significantly, the bonding pad 258 is exposed through the inorganic barrier layer 260. In some embodiments, the inorganic barrier layer 260 includes SiN, SiON, or SiCN, but the disclosure is not limited thereto. In some embodiments, a thickness of the inorganic barrier layer 260 is between approximately 0.1 μm and approximately 2 μm, but the disclosure is not limited thereto. The second die 250 further includes a second TSV structure 270 disposed therein. As shown in FIG. 2F, the second TSV structure 270 is disposed in the substrate 252 and is electrically connected to the second interconnect structure 256.

Figure 2G:
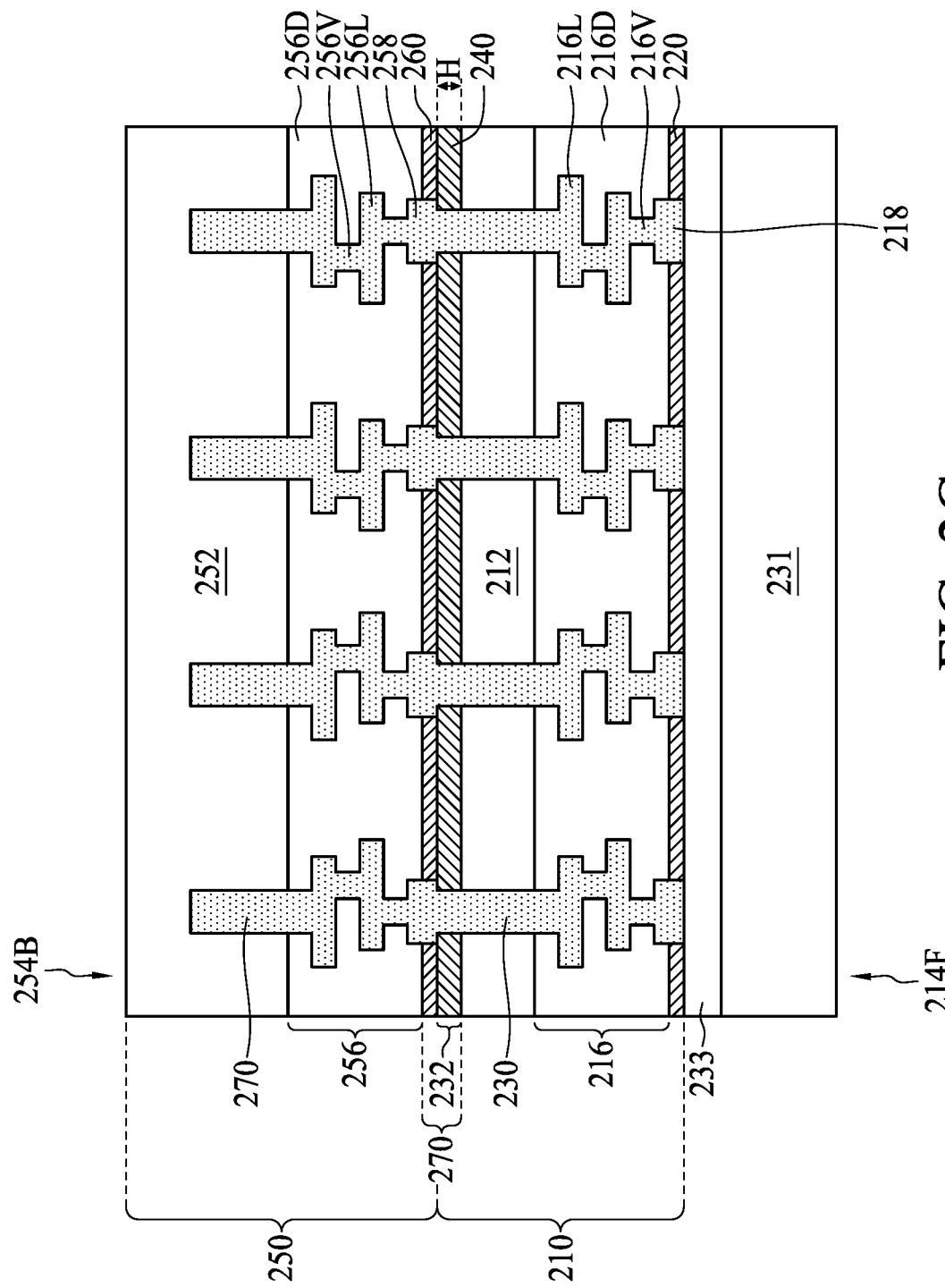

Referring to FIG. 2G, the second die 250 is flipped and bonded to the first die 210, according to step 105. In some embodiments, a bonding surface of the first die 210, that is the top surface of the organic barrier layer 240 and the end surface of the protrusion 232 of the first TSV structure 230, is pre-treated with a plasma or a wet clean. In some embodiments, a bonding surface of the second die 250, that is a top surface of the inorganic barrier layer 260 and a top surface of the bonding pad 258, is also pre-treated with a plasma or a wet clean. As shown in FIG. 2G, the first back side 214B of the first die 210 is bonded to the second front side 254F of the second die 250. Significantly, the first TSV structure 230 (i.e., the protrusion 232 of the first TSV structure 230) is bonded to the bonding pad 258, and the organic barrier layer 240 is bonded to the inorganic barrier layer 260. In some embodiments, the bonding can be performed at room temperature. In other embodiments, the bonding can be performed by an anneal. A temperature of the anneal is between approximately 200° C. and approximately 350° C., but the disclosure is not limited thereto. The anneal is performed to strengthen the bonding between the organic barrier layer 240 and the inorganic barrier layer 260. Similarly, the anneal strengthens the bonding between the protrusion 232 of the first TSV structure 230 and the bonding pad 258. Accordingly, a hybrid bonding structure 280 is formed between the first back side 214B of the first die 210 and the second front side 254F of the second die 250, as shown in FIG. 2G. In other words, the first die 210 and the second die 250 are bonded to each other by the hybrid bonding structure 280.

Figure 2H:
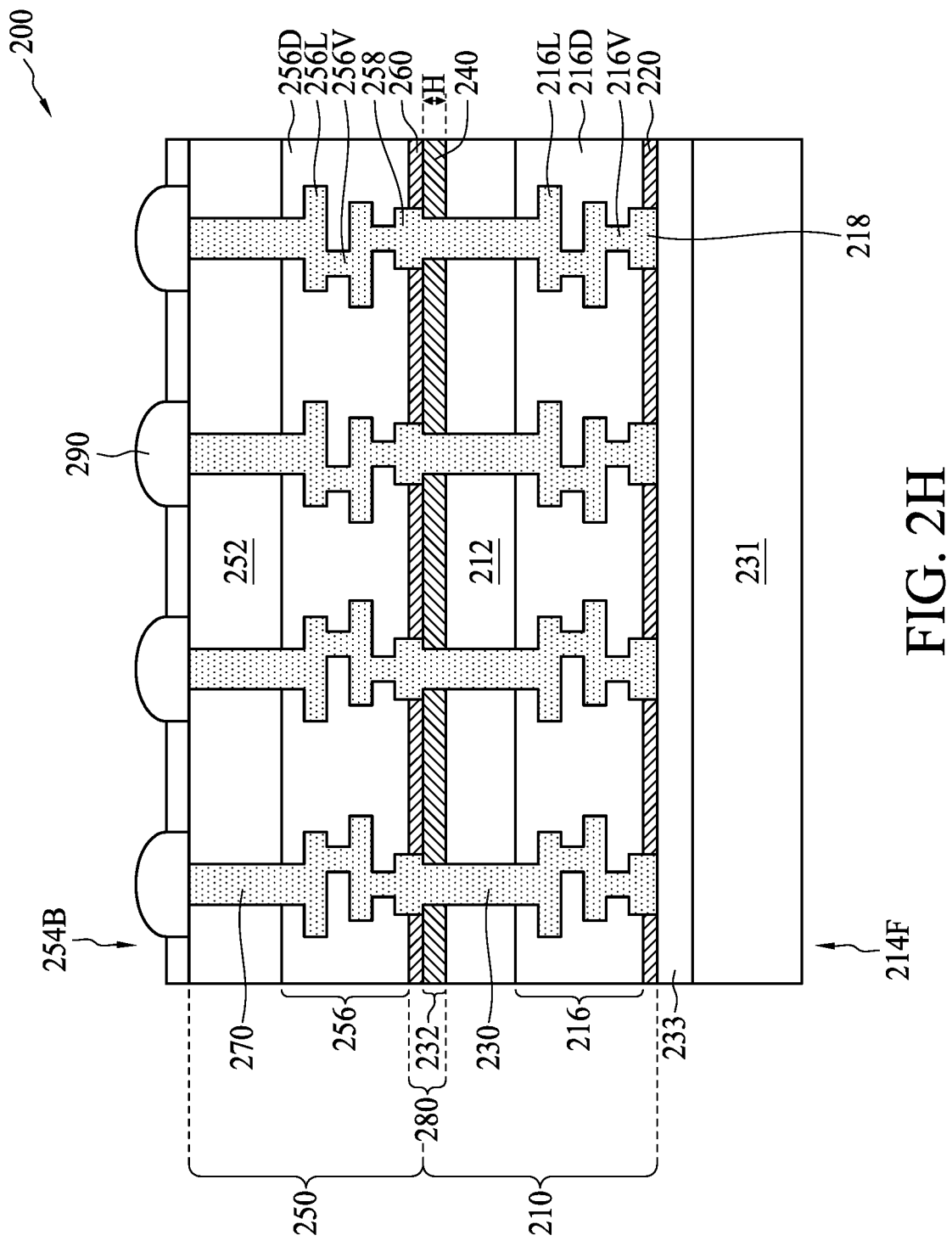

Referring to FIG. 2H, in some embodiments, a portion of the second die 250 at the second back side 254B is removed to expose the second TSV structure 270. A conductive member 290 is disposed over the second back side 254B of the second die 250. In some embodiments, a redistribution layer (RDL) (not shown) can be disposed on the second back surface 254B of the second die 250, and the conductive member 290 is disposed over the RDL. In some embodiments, the conductive member 290 is a conductive bump, which includes conductive material such as solder, copper (Cu), nickel (Ni) or gold (Au), but the disclosure is not limited thereto. In some embodiments, the conductive member 290 is a solder ball, a ball grid array (BGA) ball, a controlled collapse chip connection (C4) bump, a microbump, or a pillar, but the disclosure is not limited thereto. In some embodiments, the conductive member 290 can have a spherical, hemispherical or cylindrical shape, but the disclosure is not limited thereto. In some embodiments, first die 210 and the second die 250 can be detached from the carrier substrate 231.

Still referring to FIG. 2H, accordingly, a semiconductor package structure 200 is obtained. The semiconductor structure 200 includes the first die 210 and the second die 250 bonded to each other by the hybrid bonding structure 280. The first die 210 has the first front side 214F, which is the active side, and the first back side 214B opposite to the first front side 214F. The second die 250 has the second front side 254F, which is the active side, and the second back side 254B opposite to the second front side 254F. As mentioned above, the first die 210 includes the first interconnect structure 216 disposed over the first front side 214F and a first TSV structure 230 exposed through the first back side 214B, wherein the first TSV structure 230 is electrically connected to the first interconnect structure 216. Similarly, the second die 250 includes the second interconnect structure 256 disposed over the second front side 254F and a second TSV structure 270 exposed through the second back side 254B, wherein the second TSV structure 270 is electrically connected to the second interconnect structure 256. In some embodiments, the second interconnect structure 256 includes the bonding pad 258, as shown in FIG. 2H.

Still referring to FIG. 2H, the hybrid bonding structure 280 is disposed between the first back side 214B of the first die 210 and the second front side 254F of the second die 250. As shown in FIG. 2H, the hybrid bonding structure 280 includes the organic barrier layer 240 and the inorganic barrier layer 260 bonded to each other, and the protrusion 232 of the first TSV structure 230 and the bonding pad 258 bonded to each other. Materials and thicknesses of the organic barrier layer 240 and the inorganic barrier layer 260 can be the same as those mentioned above, and therefore such details are omitted for brevity. Additionally, the protrusion 232 of the first TSV structure 230 extends into the hybrid bonding structure 280, and the height H of the protrusion 232 within the hybrid bonding structure 280 is between approximately 1 μm and approximately 5 μm, but the disclosure is not limited thereto. In some embodiments, the height H of the protrusion 232 within the hybrid bonding structure 280 can be approximately 3 μm, but the disclosure is not limited thereto.

Still referring to FIG. 2H, the semiconductor package structure 200 further includes the conductive member 290 disposed over the second back side 254B of the second die 250, wherein the conductive member 290 is electrically connected to the second TSV structure 270. The conductive member 290 is formed to provide electrical connection to an external source.

According to the method 10 provided by present disclosure, the hybrid bonding structure 280 is formed between the first die 210 and the second die 250. In other words, the first die 210 and the second die 250 are securely bonded to each other by the forming of the hybrid bonding structure 280. As shown in FIG. 2H, in some embodiments, a difference in area may exist between the protrusion 232 of the first TSV structure 230 and the bonding pad 258, and thus either the protrusion 232 or the bonding pad 258 may be in contact with the barrier layer. For example, the protrusion 232 and/or the bonding pad 258 may be in contact with the barrier layer due to a misalignment issue. According to the embodiments of the present disclosure, the protrusion 232 may be in contact with the bonding pad 258 and the inorganic barrier layer 260, and metal diffusion can be prevented by the inorganic barrier layer 260. Similarly, the bonding pad 258 may be in contact with the protrusion 232 and the organic barrier layer 240, and metal diffusion can be prevented by the organic barrier layer 240.

Figure 3A:
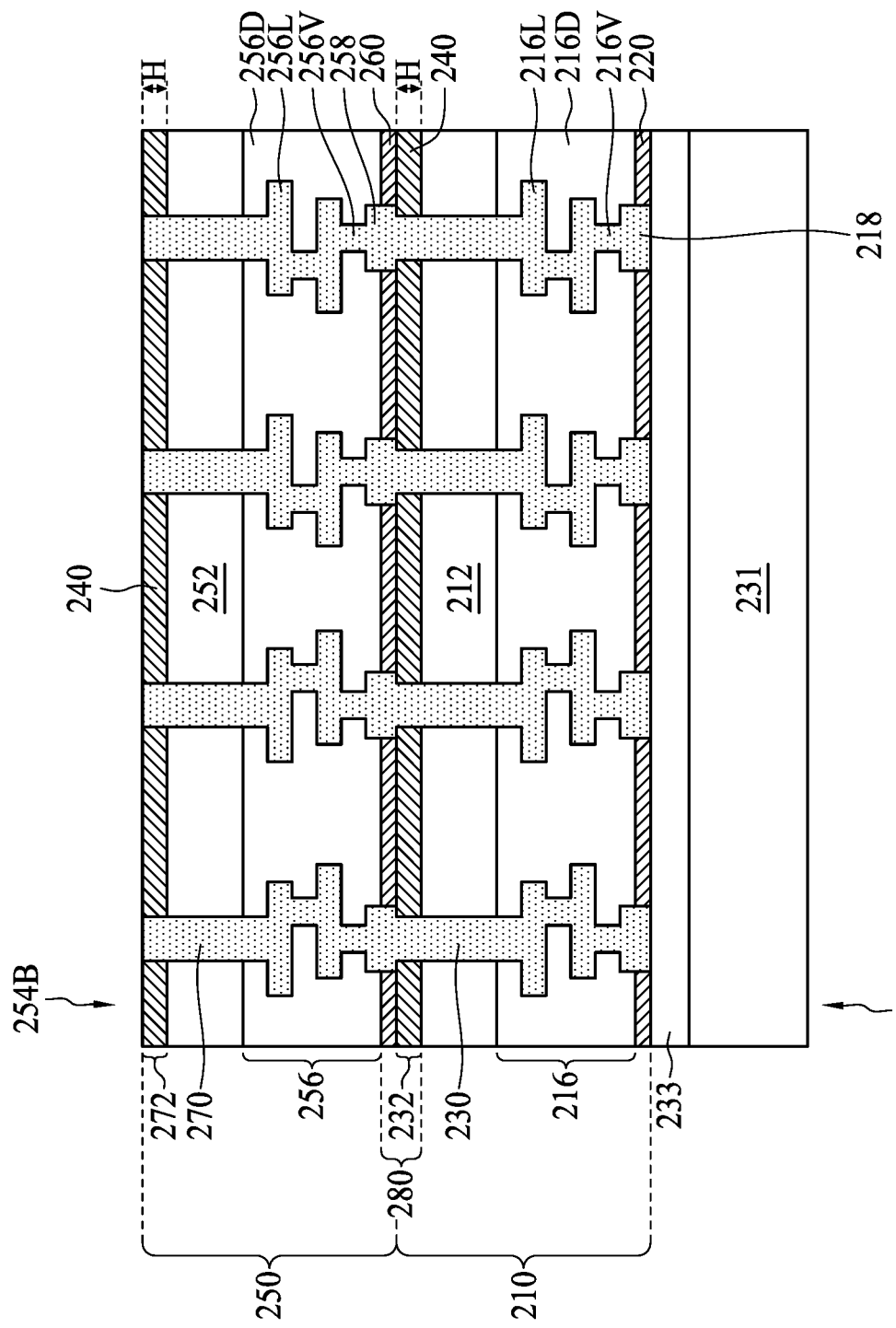
FIGS. 3A and 3B are schematic diagrams illustrating various fabrication stages of the method for preparing the semiconductor package structure in accordance with some embodiments of the present disclosure.
Figure 3B:
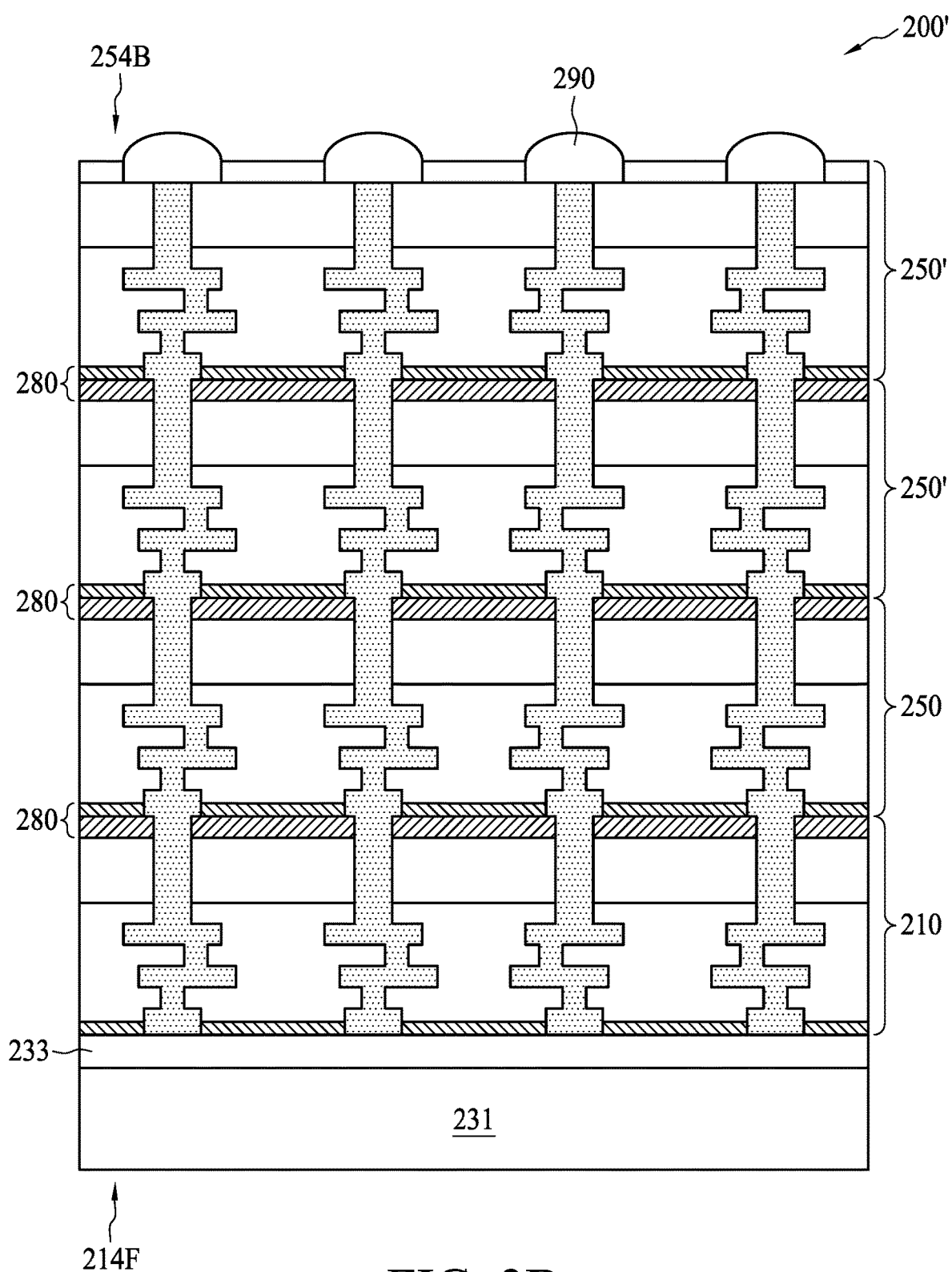

FIGS. 3A and 3B are schematic drawings illustrating various fabrication stages of the method for preparing the semiconductor package structure in accordance with some embodiments of the present disclosure. It should be understood that similar features in FIGS. 2A to 2H and FIGS. 3A and 3B can include similar materials and similar parameters, and thus descriptions of such details are omitted in the interest of brevity.

Referring to FIG. 3A, in some embodiments, step 102 to step 105 can be performed on the second die 250. For example, a portion of the second die 250 is removed at the second back side 254B according to step 102. Significantly, a portion of the substrate 212 is removed such that a portion of the second TSV structure 270 is exposed. In some embodiments, the portion of the second TSV structure 272 is protruded from the second back side 254B of the second die 254B, and thus such portion is referred to as a protrusion 272. In other words, a protrusion 270 of the second TSV structure 270 protrudes from the second back side 254B of the second die 250 after the removal of the portion of the second die 250. Further, a height H of the protrusion 272 of the second TSV structure 270 is between approximately 1 μm and approximately 5 μm, but the disclosure is not limited thereto. In some embodiments, the height H of the protrusion 252 of the second TSV structure 270 is approximately 3 μm, but the disclosure is not limited thereto.

Next, an organic barrier layer 240 is disposed over the second die 250 at the second back side 244B, according to step 103. In some embodiments, the organic barrier layer 240 is disposed to envelop the protrusion 272 of the second TSV structure 270. An end surface of the protrusion 272 and a top surface of the organic barrier layer 240 are coplanar after the planarization, as shown in FIG. 3A.

In some embodiments, another second die 250' can be provided according to step 104 and bonded to the second die 250 according to step 105. The second die 250' can be a die, a chip or a package. It should be understood that elements of the second die 250' can be similar to those of the first die 210 or the second die 250, and therefore such details are omitted in the interest of brevity.

In some embodiments, step 102 to step 105 can be repeated to according to product requirements. For example, as shown in FIG. 3B, a semiconductor package structure 200' can be formed. The semiconductor package structure 200' includes a plurality of dies 210, 250, and 250'. The dies 210, 250 and 250' are front-to-back bonded. Further, the dies 210, 250 and 250' are bonded to each other by a hybrid bonding structure 280. Steps for forming the hybrid bonding structure 280 can be similar to those described above, and therefore such details are omitted for brevity. In some embodiments, after stacking and bonding the dies 210, 250 and 250', a portion of the topmost second die 250' at the second back side 254B is removed to expose the second TSV structure 270, and a conductive member 290 is disposed over the second back side 254B of the second die 250'. Accordingly, the semiconductor package structure 200' is obtained. In some embodiments, the semiconductor package structure 200' can be detached from the carrier substrate 231 after the forming of the conductive member 290.

According to the method 10 provided by the present disclosure, the hybrid bonding structures 280 are formed between each adjacent pair of dies 210, 250 and 250'. In other words, the dies 210, 250 and 250' are securely bonded to each other by the forming of the hybrid bonding structures 280. According to the embodiments of the present disclosure, metal diffusion due to surface area difference and/or due to misalignment can be prevented by the organic barrier layer 240 and the inorganic barrier layer 260 of the hybrid bonding structures 280.

In the present disclosure, a method for preparing a semiconductor package structure is provided. According to the method, a first die and a second die are bonded to each other by a hybrid bonding structure. The hybrid bonding structure includes an organic layer and an inorganic layer. Significantly, both of the organic and inorganic layers perform a metal diffusion prevention function. Therefore, even if a misalignment issue arises between the first TSV structure of the first die and the bonding pad of the second die, metal diffusion can be prevented by the hybrid bonding structure. Alternatively, in some embodiments, when there is a size difference between the first TSV structure and the bonding pad, metal diffusion can be prevented by the hybrid bonding structure.

One aspect of the present disclosure provides a semiconductor package structure. The semiconductor package structure includes a first die, a second die and a hybrid bonding structure disposed between the first die and the second die. The first die includes a first front side and a first back side opposite to the first front side. The second die includes a second front side and a second back side opposite to the second front side. The hybrid bonding structure is disposed between the first back side of the first die and the second front side of the second die. The first die and the second die are bonded to each other by the hybrid bonding structure. The hybrid bonding structure includes an organic barrier layer and an inorganic barrier layer bonded to each other.

One aspect of the present disclosure provides a method for preparing a semiconductor package structure. The method includes the following steps. A first die having a first front side, a first back side opposite to the first front side, and a first TSV structure disposed in the first die is provided. A portion of the first die at the first back side is removed to expose the first TSV structure. An organic barrier layer is disposed over the first back side of the first die. A second die having a second front side, a second back side opposite to the second front side, a bonding pad exposed through the second front side, and an inorganic barrier layer disposed over the second front side is provided. The organic barrier layer of the first die and the inorganic barrier layer of the second die are bonded, and the first TSV structure of the first die and the bonding pad of the second die are bonded.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor package structure comprising:
a first die having a first front side and a first back side opposite to the first front side, wherein the first die includes a first through-silicon via (TSV) structure exposed through the first back side, and the first TSV structure comprises a protrusion protruding from the first back side;
a second die having a second front side and a second back side opposite to the second front side, wherein the second die includes a bonding pad exposed through the second front side; and
a hybrid bonding structure disposed between the first back side of the first die and the second front side of the second die,
wherein the first die and the second die are bonded to each other by the hybrid bonding structure, and the hybrid bonding structure comprises an organic barrier layer and an inorganic barrier layer bonded to each other, wherein the organic barrier layer is disposed over the first back side of the first die and the protrusion of the first TSV structure extends into and is coupled with the organic barrier layer, wherein the inorganic barrier layer is disposed over the second front side of the second die;
wherein the protrusion of the first TSV structure of the first die is bonded to the bonding pad of the second die.

2. The semiconductor package structure of claim 1, wherein the first die further comprises:
a first interconnect structure disposed over the first front side,
wherein the first TSV structure is electrically connected to the first interconnect structure.

3. The semiconductor package structure of claim 1, wherein a height of the protrusion of the first TSV structure is between approximately 1 µm and approximately 5 µm.

4. The semiconductor package structure of claim 1, wherein the second die further comprises:
a second TSV structure exposed through the second back side; and
a second interconnect structure disposed over the second front side;
wherein the second interconnect structure is electrically connected to the second TSV structure and the bonding pad.

5. The semiconductor package structure of claim 4, further comprising a conductive member disposed over the second back side of the second die, wherein the conductive member is electrically connected to the second TSV structure.

6. The semiconductor package structure of claim 1, wherein the organic barrier layer of the hybrid bonding structure comprises benzocyclobutene (BCB), polybenzoxazoles (PBO), or polyimide (PI).

7. The semiconductor package structure of claim 1, wherein a thickness of the organic barrier layer is between approximately 1 µm and approximately 5 µm.

8. The semiconductor package structure of claim 1, wherein the inorganic barrier layer of the hybrid bonding structure comprises silicon nitride (SiN), silicon oxynitride (SiON), or silicon carbon nitride (SiCN).

9. The semiconductor package structure of claim 1, wherein a thickness of the inorganic barrier layer is between approximately 0.1 µm and approximately 2 µm.

10. A method for preparing a semiconductor package structure, comprising:
providing a first die having a first front side, a first back side opposite to the first front side, and a first TSV structure disposed in the first die, wherein the first TSV structure comprises a protrusion protruding from the first back side;
removing a portion of the first die at the first back side to expose the first TSV structure and to form a protrusion protruding from the first back side of the first die;
disposing an organic barrier layer over the first die at the first back side and coupled with the protrusion of the first TSV structure;
providing a second die having a second front side, a second back side opposite to the second front side, a bonding pad exposed through the second front side of the second die, and an inorganic barrier layer disposed over the second die at the second front side; and
bonding the organic barrier layer of the first die and the inorganic barrier layer of the second die and bonding the protrusion of the first TSV structure of the first die and the bonding pad of the second die.

11. The method of claim 10, wherein a height of the protrusion of the first TSV structure is between approximately 1 µm and approximately 5 µm.

12. The method of claim 10, wherein the disposing of the organic barrier layer further comprises:
disposing the organic barrier layer to envelop the protrusion of the first TSV structure; and
performing a planarization on the organic barrier layer to expose an end surface of the protrusion.

13. The method of claim 12, wherein the end surface of the protrusion and a top surface of the organic barrier layer are coplanar after the planarization.

14. The method of claim 10, wherein the organic barrier layer comprises BCB, POB or PI.

15. The method of claim 10, wherein the inorganic barrier layer comprises SiN, SiON or SiCN.

16. The method of claim 10, wherein the second die comprises a second TSV structure disposed therein.

17. The method of claim 16, further comprising:
removing a portion of the second die at the second back side to expose the second TSV structure; and
disposing a conductive member over the second back side of the second die,
wherein the conductive member is electrically connected to the second TSV structure.

* * * * *